United States Patent
Olander et al.

(10) Patent No.: US 10,229,840 B2
(45) Date of Patent: Mar. 12, 2019

(54) ION IMPLANTER COMPRISING INTEGRATED VENTILATION SYSTEM

(71) Applicant: ENTEGRIS, INC., Billerica, MA (US)

(72) Inventors: W. Karl Olander, Indian Shores, FL (US); Ying Tang, Brookfield, CT (US); Barry Lewis Chambers, Midlothian, VA (US); Steven E. Bishop, Corrales, NM (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/522,499

(22) PCT Filed: Oct. 29, 2015

(86) PCT No.: PCT/US2015/057947
§ 371 (c)(1),
(2) Date: Apr. 27, 2017

(87) PCT Pub. No.: WO2016/069836
PCT Pub. Date: May 6, 2016

(65) Prior Publication Data
US 2017/0338130 A1 Nov. 23, 2017

Related U.S. Application Data

(60) Provisional application No. 62/072,980, filed on Oct. 30, 2014.

(51) Int. Cl.
*H01L 21/00* (2006.01)
*H01L 21/67* (2006.01)
(Continued)

(52) U.S. Cl.
CPC ........ *H01L 21/67017* (2013.01); *C23C 14/48* (2013.01); *H01J 37/3171* (2013.01);
(Continued)

(58) Field of Classification Search
CPC ......... H01L 21/67017; H01L 21/26513; H01L 21/67253; C23C 14/48; H01J 37/3171
See application file for complete search history.

(56) References Cited

U.S. PATENT DOCUMENTS 6,302,139 B1 10/2001 Dietz
2016/0305682 A1 10/2016 Olander et al.

FOREIGN PATENT DOCUMENTS

JP 2000-306542 A 11/2000
JP 2003-207181 A 7/2003
(Continued)

*Primary Examiner* — Richard A Booth
(74) *Attorney, Agent, or Firm* — Entegris, Inc.

(57) ABSTRACT

An ion implantation system is described, including: an ion implanter comprising a housing defining an enclosed volume in which is positioned a gas box configured to hold one or more gas supply vessels, the gas box being in restricted gas flow communication with gas in the enclosed volume that is outside the gas box; a first ventilation assembly configured to flow ventilation gas through the housing and to exhaust the ventilation gas from the housing to an ambient environment of the ion implanter; a second ventilation assembly configured to exhaust gas from the gas box to a treatment apparatus that is adapted to at least partially remove contaminants from the gas box exhaust gas, or that is adapted to dilute the gas box exhaust gas, to produce a treated effluent gas, the second ventilation assembly comprising a variable flow control device for modulating flow rate of the gas box exhaust gas between a relatively lower gas box exhaust gas flow rate and a relatively higher gas box exhaust gas flow rate, and a motive fluid driver adapted to flow the gas box exhaust gas through the variable flow control device to the treatment apparatus; and a monitoring and control assembly configured to monitor operation of the ion implanter for occurrence of a gas hazard event, and thereupon to responsively prevent gas-dispensing operation (Continued)

of the one or more gas supply vessels, and to modulate the variable flow control device to the relatively higher gas box exhaust gas flow rate so that the motive fluid driver flows the gas box exhaust gas to the treatment apparatus at the relatively higher gas box exhaust gas flow rate. Preferably, in a gas hazard event, the shell exhaust discharge from the housing is also terminated, to facilitate exhausting all gas within the housing, outside as well as inside the gas box, to the treatment unit.

17 Claims, 1 Drawing Sheet

(51) Int. Cl.
*C23C 14/48* (2006.01)
*H01J 37/317* (2006.01)
*H01L 21/265* (2006.01)
*H01L 21/66* (2006.01)

(52) U.S. Cl.
CPC .. *H01L 21/26513* (2013.01); *H01L 21/67253* (2013.01); *H01L 22/20* (2013.01); *H01J 2237/006* (2013.01); *H01J 2237/1825* (2013.01); *H01J 2237/31701* (2013.01)

(56) References Cited

FOREIGN PATENT DOCUMENTS

| KR | 10-1999-0018370 | 3/1999 |
| KR | 10-2009-0060020 | 6/2009 |
| WO | 2011/088061 A2 | 7/2011 |
| WO | 2016/069836 A1 | 5/2016 |

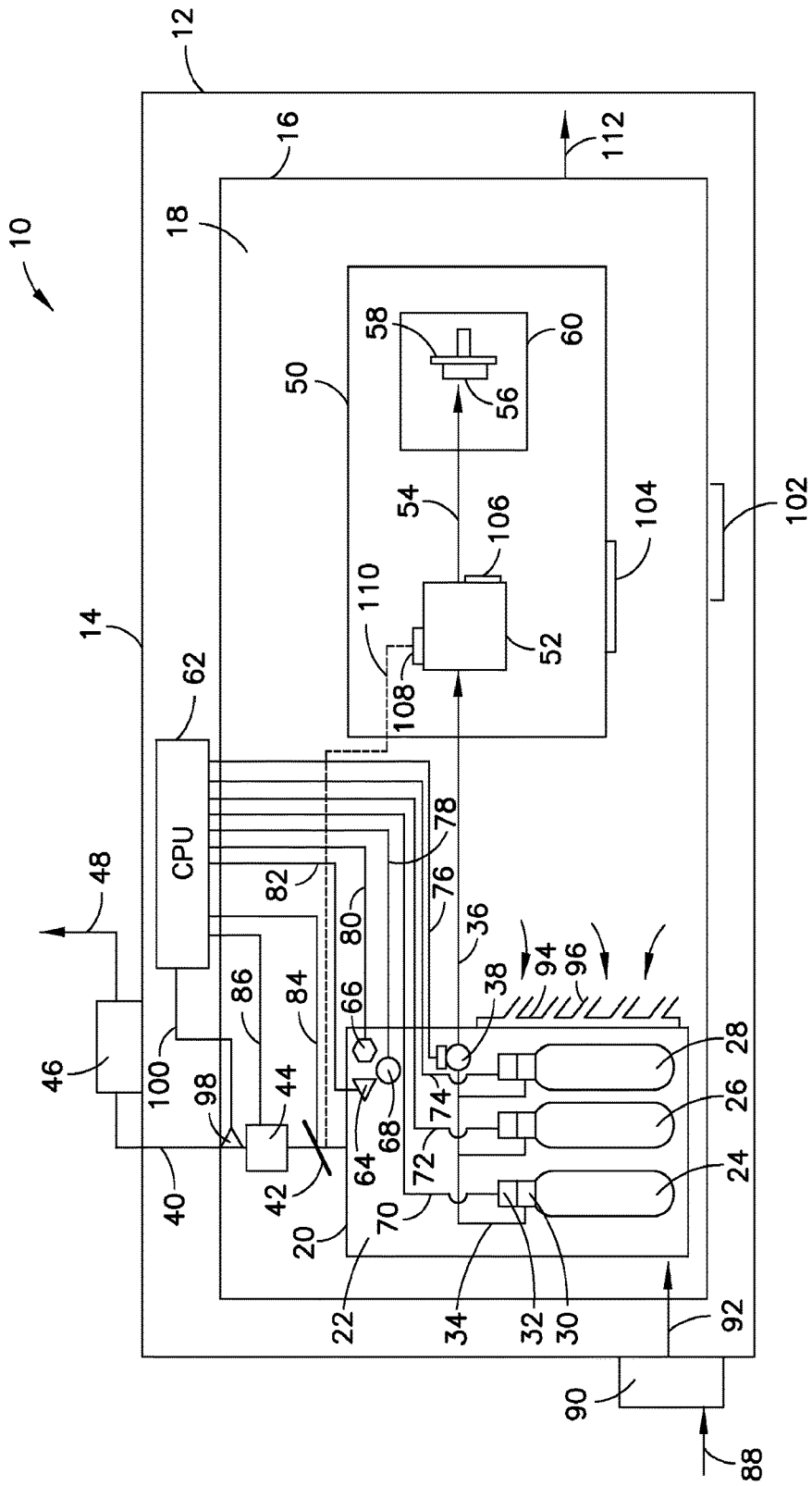

ION IMPLANTER COMPRISING INTEGRATED VENTILATION SYSTEM

CROSS-REFERENCE TO RELATED APPLICATION

The benefit of priority under 35 U.S.C. § 119 of U.S. Provisional Patent Application No. 62/072,980 filed Oct. 30, 2014 is hereby claimed. The disclosure of U.S. Provisional Patent Application No. Ser. 62/072,980 is hereby incorporated herein by reference, for all purposes.

FIELD

The present disclosure relates to ion implantation apparatus and methods, and more specifically to apparatus and methods of such type comprising an integrated ventilation system for enhanced safety and efficiency of operation.

DESCRIPTION OF THE RELATED ART

Ion implantation is a unit operation of great significance in the semiconductor manufacturing industry. Commercial ion implantation apparatus is typically configured to include an outer enclosure housing within which is disposed in a gas box containing gas supply vessels coupled with appropriate gas delivery flow circuitry for flowing gas to the ion implanter tool located within such housing. The ion implanter tool may include an ion source chamber in which the supplied gas is subjected to ionization conditions to form implant species that then may be selected by atomic mass selection equipment, beam generation and collimation equipment, for impingement on a substrate mounted in an ion implantation chamber for implant of dopant species therein, in the manufacture of semiconductor products, flat-panel displays, solar panels, and the like.

Since the gas is contained in the gas supply vessels in the gas box are frequently of a toxic or otherwise hazardous character, the outer enclosure housing of the ion implantation apparatus is arranged so that clean dry air or other ventilation gas is flowed into the housing. The gas box is typically ranged in restricted gas communication with the so-called "shell" of the apparatus (i.e., the volume within the outer enclosure housing exterior to the interior volume of the gas box) so that gas from the shell is drawn into the gas box and then exhausted through an exhaust duct of the gas box, under the impetus of exhaust blowers or exhaust fans or other motive fluid driver equipment.

The ventilation gas flowing through the shell is termed shell exhaust, and the ventilation gas deriving from the shell exhaust that flows through and is discharged from the gas box is termed gas box exhaust. The restricted gas communication between the shell and the gas box interior volume may be constituted by louvers in an access door or other gas flow passages present in or defined by structure of the gas box.

The ventilation gas, typically air, which is introduced to the outer enclosure housing of the ion implantation apparatus in the first instance is subject to strict specifications as regards its humidity, temperature, purity, and particulate-free character. To meet these strict specifications, the air is subjected to filtration, cooling, humidification/dehumidification, and purification operations, which entail substantial expense in respect of the associated capital equipment and operating costs.

The gas box exhaust deriving from the shell exhaust flows through the ductwork associated with the gas box to a treatment unit. The treatment unit may be constituted as a roof-mounted treatment installation on a fab building in which the ion implantation apparatus is operated. The treatment unit may be of any suitable type, and may for example include an acid scrubber or water scrubber to remove contaminants species from the gas box exhaust, with the scrubbed exhaust being discharged to the atmosphere. Alternatively, the treatment unit may comprise a dilution unit, in which the gas box exhaust is substantially diluted with a large volume of air and then vented directly to the atmosphere.

The ventilation gas makeup, conditioning, and exhaust operations associated with the ion implantation apparatus therefore represent a critical aspect of the safe and efficient performance of such apparatus, but as mentioned above involve substantial capital equipment and operating costs in the manufacturing facilities in which they are employed.

SUMMARY

The present disclosure relates to ion implantation apparatus and methods.

In one aspect, the disclosure relates to an ion implantation system, comprising: an ion implanter comprising a housing defining an enclosed volume in which is positioned a gas box configured to hold one or more gas supply vessels, the gas box being in restricted gas flow communication with gas in the enclosed volume that is outside the gas box; a first ventilation assembly configured to flow ventilation gas through the housing and to exhaust the ventilation gas from the housing to an ambient environment of the ion implanter; a second ventilation assembly configured to exhaust gas from the gas box to a treatment apparatus that is adapted to at least partially remove contaminants from the gas box exhaust gas, or that is adapted to dilute the gas box exhaust gas, to produce a treated effluent gas, the second ventilation assembly comprising a variable flow control device for modulating flow rate of the gas box exhaust gas between a relatively lower gas box exhaust gas flow rate and a relatively higher gas box exhaust gas flow rate, and a motive fluid driver adapted to flow the gas box exhaust gas through the variable flow control device to the treatment apparatus; and a monitoring and control assembly configured to monitor operation of the ion implanter for occurrence of a gas hazard event, and thereupon to responsively prevent gas-dispensing operation of the one or more gas supply vessels, and to modulate the variable flow control device to the relatively higher gas box exhaust gas flow rate so that the motive fluid driver flows the gas box exhaust gas to the treatment apparatus at the relatively higher gas box exhaust gas flow rate.

In another aspect, the disclosure relates to a method of operating an ion implantation system including an ion implanter comprising a housing defining an enclosed volume in which is positioned a gas box configured to hold one or more gas supply vessels, the gas box being in restricted gas flow communication with gas in the enclosed volume that is outside the gas box, such method comprising: flowing ventilation gas through the housing and exhausting the ventilation gas from the housing to an ambient environment of the ion implanter; exhausting gas from the gas box and treating same to at least partially remove contaminants from the gas box exhaust gas, or to dilute the gas box exhaust gas, to produce a treated effluent gas; monitoring operation of the ion implanter for occurrence of a gas hazard event; during non-occurrence of a gas hazard event during said monitoring, exhausting gas from the gas box for said treating, at a relatively lower gas box exhaust flow rate; and upon occurrence of a gas hazard event during said monitoring, preventing gas-dispensing operation of the one or more gas supply vessels, and exhausting gas from the gas box for said treating, at a relatively higher gas box exhaust flow rate.

Other aspects, features and embodiments of the disclosure will be more fully apparent from the ensuing description and appended claims.

BRIEF DESCRIPTION OF THE DRAWINGS

FIG. 1 is a simplified schematic representation of a semiconductor manufacturing facility including an ion implantation apparatus, according to one embodiment of the present disclosure.

DETAILED DESCRIPTION

The present disclosure relates to ion implantation apparatus and methods.

The ion implantation system configuration of the present disclosure enables elimination of flow circuitry that otherwise is employed for flowing shell exhaust from an implanter to vent same to the atmosphere, e.g., from a rooftop vent of the semiconductor manufacturing facility, as has heretofore been the conventional practice in semiconductor manufacturing fabs.

The shell exhaust is the ventilation gas that is flowed through and subsequently discharged from the housing of the ion implantation system. The gas box is disposed within the housing of the ion implantation system, and is in restricted gas communication with the gas in the housing that is outside the gas box. For example, the gas box may be provided with an access door or other access structure that enables passage of gas into the gas box from the exterior environment of the gas box within the housing, e.g., through louvers in the access door, or other gas passages in the access structure or other structural portions of the gas box. During ion implantation operations, the gas box is exhausted by fans or other gas-drawing equipment serving to remove ventilation gas from the gas box. A negative pressure thereby is created in the gas box, which serves to draw ventilation gas into the interior of the gas box from the "shell side" of the gas box (the shell side being exterior to the gas box, and within the ion implantation system housing). The ventilation gas that is removed from the gas box by the gas-drawing equipment then is subjected to treatment by scrubbing or dilution and discharged to the atmosphere, while the shell side exhaust is simply discharged from the ion implantation apparatus housing to the fab environment, e.g., inside the building which the ion implantation system is provided, rather than being discharged to the atmosphere, as has been the prior practice for shell side exhaust from ion implantation equipment installations.

By eliminating the flow circuitry for flowing shell exhaust from the implanter to a rooftop venting system, a substantial reduction of capital costs as well as operating costs for the ion implantation system can be achieved, since it is not necessary to install ductwork and associated fans/blowers for moving the shell exhaust to the roof of the semiconductor manufacturing facility. Further, since the shell exhaust is returned to the fab environment, the expenditures that are otherwise involved in taking in ambient air in the first instance, and subjecting it to filtration, purification, and humidification/dehumidification for use as ventilation gas, are reduced by the reuse of the shell exhaust rather than simply discharging it to the atmosphere from the rooftop vent in a single-pass fashion. Thus, the equipment otherwise required to replenish the air used for ventilation gas, including filters, humidifiers, chillers, blowers, and associated ductwork can be substantially reduced in size and capacity, thereby achieving reduced operating expense. As a specific example, the deployment of ion implantation systems that are configured in accordance with the present disclosure, in a fab containing 30 implanters, could reduce ventilation gas requirements for the facility by 60,000 ft.$^3$ per minute of ventilation gas, or more, in the operation of such facility.

The configuration of the ion implantation system in accordance with the present disclosure may in specific embodiments comprise utilizing pneumatic actuators on gas supply cylinder valve heads, and configuring the monitoring and control system of the implanter to monitor the shell environment and the gas box environment of the implanter for contaminants indicative of gas leakage from a gas supply cylinder in the gas box, so that in the event of a leak, the monitoring and control system operates to automatically close the gas supply cylinder valves, and open dampers on the gas box to exhaust the gas box at high volumetric gas flow rate, relative to the low volumetric gas flow rate that is utilized in normal operation of the ion implanter.

The gas supply cylinders may be configured to further enhance safety of operation of the ion implantation system, as adsorbent-based gas supply cylinders, or as pressure-regulated gas supply cylinders including one or more pressure regulators in an interior volume of the vessel.

The ion implantation system in accordance with the present disclosure therefore may be configured so that when the monitoring and control system detects any toxic or otherwise hazardous contaminant in the shell exhaust, it operates to stop the fans blowing the shell exhaust into the fab, and increases airflow through the gas box so that the shell gas in the implanter housing is drawn into the gas box for increased rate of exhaust to the roof-mounted or other treatment apparatus.

The ion implantation system may be configured in specific embodiments with a 2-position damper on the gas box that is monitored and controlled in implanter operation. When the ion implantation system is operating in a normal mode and hazardous gas is being supplied from a gas source vessel in the gas box at sub-atmospheric pressure, the monitoring and control system operates the implanter in a "miser/low flow mode" of operation. When the gas source vessels in the gas box are exchanged and/or technicians are otherwise working in the gas box, the monitoring and control system operates the implanter in a high flow mode in which the gas box is exhausted at an increased rate with shell gas being drawn into the gas box and exhausted to the roof-mounted or other treatment apparatus at a high ventilation rate. The exhaust gas may also be originated from the room (e.g., a clean room) in the building in which the ion implantation equipment resides, such as where a door in the ion implantation apparatus housing is open to allow gas from the room to flow into the housing and then into the gas box from the shell of the ion implantation apparatus.

By configuring the ion implantation system to operate in an increased ventilation rate mode with a "smart" damper assembly, the ion implantation system achieves both substantial reduction of energy requirements, since the system is able to operate in the low flow mode of operation under normal conditions, and achieves substantial enhancement in safety characteristics of the ion implantation system, operating in a high flow mode during gas hazard, e.g., leakage of hazardous gas, events and during maintenance operations by personnel in the ion implantation system.

The approach of the present disclosure in application to new fab construction is able to effect substantial reduction in capital equipment costs, since the ability to avoid venting the shell exhaust of the implanter to the atmosphere or otherwise exterior of the fab, permits savings in ductwork, fans, air purification systems, etc. that would otherwise be incurred if the conventional approach of venting shell exhaust to the atmosphere were to be employed.

In one aspect, the present disclosure relates to an ion implantation system, comprising: an ion implanter comprising a housing defining an enclosed volume in which is positioned a gas box configured to hold one or more gas supply vessels, the gas box being in restricted gas flow communication with gas in the enclosed volume that is outside the gas box; a first ventilation assembly configured to flow ventilation gas through the housing and to exhaust the ventilation gas from the housing to an ambient environment of the ion implanter (e.g., within a fab building in which the ion implantation system is deployed); a second ventilation assembly configured to exhaust gas from the gas box to a treatment apparatus that is adapted to at least partially remove contaminants from the gas box exhaust gas, or that is adapted to dilute the gas box exhaust gas, to produce a treated, and benign, effluent gas, the second ventilation assembly comprising a variable flow control device for modulating flow rate of the gas box exhaust gas between a relatively lower gas box exhaust gas flow rate and a relatively higher gas box exhaust gas flow rate, and a motive fluid driver adapted to flow the gas box exhaust gas through the variable flow control device to the treatment apparatus; and a monitoring and control assembly configured to monitor operation of the ion implanter for occurrence of a gas hazard event, and thereupon to responsively prevent gas-dispensing operation of the one or more gas supply vessels, and to modulate the variable flow control device to the relatively higher gas box exhaust gas flow rate so that the motive fluid driver flows the gas box exhaust gas to the treatment apparatus at the relatively higher gas box exhaust gas flow rate.

As used herein, the term "gas hazard event" is intended to be broadly construed to encompass any event that may occur or increase in magnitude or severity as a consequence of inadequate ventilation gas flow rate in an ion implantation system or the facilities in which such system is deployed. Such events may include, without limitation, leakage of a toxic or otherwise hazardous gas component in the ion implantation system, e.g., a leak or failure in the dopant delivery gas dispensing system, overheating of equipment or components of the ion implantation system, equipment or component malfunctions or failures, or any other occurrences that impair or adversely affect the ion implantation system, facilities in which such system is deployed, or personnel operating or otherwise in proximity to such system or facilities.

As used herein, the term "ambient environment" in reference to the ion implanter means an environment outside of the housing of the ion implanter and within the building or other structural facility in which the ion implanter is disposed, e.g., a clean room in which the ion implanter is installed.

In one specific embodiment of the ion implantation system as broadly described above, the monitoring and control assembly may be configured to terminate operation of the first ventilation assembly upon a gas hazard event, e.g., by stopping the operation of the shell exhaust booster fans discharge shell exhaust from the housing of the ion implantation system.

The ion implantation system may be configured with the variable flow control device comprising a variable position flow damper device, e.g., a two-position flow damper device, a variable position flow damper device, or other variable flow control device that can be modulated to effect high volumetric flow rate exhaust from the gas box in a gas hazard event.

The treatment apparatus of the above-described ion implantation system may in specific embodiments comprise a rooftop treatment unit on a roof of a fab comprising the ion implanter. Such a rooftop treatment unit may in particular embodiments comprise a wet or dry scrubber, catalytic oxidation unit, and/or adsorbent having sorptive affinity for contaminants of the gas, to effect removal of contaminants from the gas. Alternatively, the treatment apparatus may comprise a dilution apparatus that is configured to substantially dilute the gas box exhaust gas with large volumes of air, to produce a treated effluent gas.

The monitoring and control assembly likewise may be widely varied in the broad practice of the present disclosure. In specific embodiments, the monitoring and control assembly may comprise pneumatic valve actuators arranged to actuate flow control valves of the one or more gas supply vessels when present in the gas box. The gas box may in specific implementations contain one gas supply vessel, or more than one gas supply vessel. For example, in specific embodiments, multiple gas supply vessels may be present, including dopant precursor supply vessels supplying precursor for ionization to form implant species for the ion implantation operation. Multiple vessels may be present, with automated switch-over apparatus configured to switch gas dispensing operation from an exhausted gas supply vessel to a fresh vessel in the gas box, by appropriate manifolding and valving arrangements. The multiple vessels may include vessels containing ancillary gases, such as co-flow, co-reactant, diluent, cleaning or other gases to accommodate operation of the ion implantation system.

The gas supply vessels may be adsorbent-based vessels, containing adsorbent having sorptive affinity for gas to be stored on the adsorbent and desorbed therefrom under dispensing conditions. Such gas supply vessels may be equipped with pneumatic valve actuators arranged to actuate flow control valves of the gas supply vessels in the gas box. The gas supply vessels alternatively may comprise pressure-regulated gas supply vessels, having one or more gas pressure regulators interiorly disposed in an interior volume of the vessel, to controllably dispense gas from the vessel at a set point pressure of the pressure regulator, or, when a series arrangement of pressure regulators is employed, at a set point pressure of the downstream pressure regulator closest to the valve head of the vessel. Thus, the monitoring and control assembly may comprise pneumatic valve actuators associated with pressure-regulated vessels. Other suitable types of gas supply vessels may be employed, in the broad practice of the present disclosure.

The motive fluid driver that is utilized in the ion implantation system to flow the gas box exhaust gas through the variable flow control device to the treatment apparatus may be of any suitable type, and may comprise a variable driver blower or fan. The motive fluid driver may comprise a variable frequency driver.

Various arrangements of the monitoring and control assembly may be employed. In various embodiments, one or more sensors may be configured to sense process condition(s) within the enclosure (inside and/or outside of the gas box), and to responsively modulate the variable flow control device based on process condition sensing of the one or more sensors. Such sensors may comprise pressure sensors, temperature sensors, toxic gas monitors, or other sensing or detection devices or assemblies. The safest mode of ion implant system operation involves gas delivery at sub-atmospheric pressure. The sensors may correspondingly comprise pressure sensors monitoring gas supply piping, and generating an alarm output or flow termination output signal when monitored pressure in the gas supply line exceeds a predetermined maximum value, or exceeds a predetermined rate of change of pressure in the gas supply line (so as to accommodate small pressure fluctuations that are non-deleterious in character).

The ion implantation system may itself be variously configured, and may comprise beam line ion implantation equipment, or plasma immersion ion implantation equipment, or ion implantation equipment of other types. In various embodiments, the ion implanter in the ion implantation system may comprise an ion source chamber that is arranged to receive gas from at least one of the one or more gas supply vessels in the gas box, by flow of dispensed gas through gas flow circuitry interconnecting such gas-dispensing gas supply vessel(s) with the ion source chamber.

The monitoring and control assembly may be arranged in such an ion implantation system to prevent gas-dispensing operation from the gas-dispensing gas supply vessel(s) in the event the one or more process conditions deviate from predetermined process condition(s), as the aforementioned gas hazard event. The monitoring and control assembly may for example be configured to terminate flow of dispensed gas from the gas-dispensing gas supply vessel(s) when pressure in the gas box deviates from a sub-atmospheric pressure condition, as the aforementioned gas hazard event. The monitoring and control assembly then may terminate flow of dispensed gas by actuating valve actuators to control gas supply valves of the gas-dispensing gas supply vessel(s) and/or to close gas flow control valve(s) in the flow circuitry.

Accordingly, the monitoring and control assembly may be configured to maintain the gas box at sub-atmospheric pressure during dispensing of gas from the one or more gas supply vessels in the gas box.

In various embodiments, the ion implantation system may be configured, in which the gas box includes an access structure that is openable to permit installation or change-out of gas supply vessels in the gas box, and closable to configure the gas box for operation, wherein the monitoring and control assembly is configured to modulate the variable flow control device to the relatively higher gas box exhaust gas flow rate so that the motive fluid driver flows the gas box exhaust gas to the treatment apparatus at the relatively higher gas box exhaust gas flow rate, when the gas box access structure is opened.

Such arrangement provides a high degree of safety for workers requiring access to the gas box or maintenance, inspection, reloading of the gas box with gas supply vessels, and other access activities.

In other embodiments, the ion implantation system may be configured with a monitoring and control assembly that comprises a gas flow line that is selectively coupleable to interconnect a vacuum chamber of the ion implantation system with the second ventilation assembly for ventilating the vacuum chamber during access thereof by operating, inspection, or maintenance personnel. For such purpose, the vacuum chamber may comprise a selectively removable cover enabling coupling of the gas flow line to the vacuum chamber.

In other implementations, the ion implantation system may include a monitoring and control assembly that is configured to terminate operation of the first ventilation assembly upon occurrence of the gas hazard event. The first ventilation assembly may comprise shell exhaust blowers, fans, and/or other ventilation equipment, as appropriate to the specific application involved.

The ion implantation system may be configured in still other embodiments so that the occurrence of the gas hazard event comprises detection by the monitoring and control assembly of hazardous gas in the ventilation gas in the gas box or in the ventilation gas in the housing.

The ion implantation system may be configured with the first ventilation assembly not being connected either directly or indirectly to a gas treatment facility.

The disclosure relates in another aspect to a semiconductor manufacturing facility comprising an ion implantation system of the disclosure as variously described herein, with the treatment apparatus comprising a rooftop treatment unit on a roof of the facility. Such semiconductor manufacturing facility may be constituted so that the facility does not comprise any ductwork for rooftop venting of the shell exhaust.

In another aspect, the disclosure relates to a method of operating an ion implantation system including an ion implanter comprising a housing defining an enclosed volume in which is positioned a gas box configured to hold one or more gas supply vessels, the gas box being in restricted gas flow communication with gas in the enclosed volume that is outside the gas box, such method comprising: flowing ventilation gas through the housing and exhausting the ventilation gas from the housing to an ambient environment of the ion implanter; exhausting gas from the gas box and treating same to at least partially remove contaminants from the gas box exhaust gas, or to dilute the gas box exhaust gas, to produce a treated effluent gas; monitoring operation of the ion implanter for occurrence of a gas hazard event; during non-occurrence of a gas hazard event during said monitoring, exhausting gas from the gas box for said treating, at a relatively lower gas box exhaust flow rate; and upon occurrence of a gas hazard event during said monitoring, preventing gas-dispensing operation of the one or more gas supply vessels, and exhausting gas from the gas box for said treating, at a relatively higher gas box exhaust flow rate.

This method may be implemented in a manner such that upon occurrence of the gas hazard event, the flow of ventilation gas through the housing, and the exhaust of the ventilation gas from the housing to an ambient environment of the ion implanter, are terminated.

Treatment in the aforementioned method may comprise gas treatment in a rooftop treatment unit on a roof of a fab comprising the ion implanter.

In the method broadly described above, each of the one or more gas supply vessels may have a pneumatic valve actuator operatively coupled thereto, with the pneumatic valve actuators being actuated for prevention of gas-dispensing operation. The vessels as previously described may comprise one or more adsorbent-based gas supply vessels, or one or more pressure regulated gas supply vessels, or vessels of both types, or of other types.

The monitoring operation in the aforementioned method may comprise monitoring process condition(s) in the enclosure outside of the gas box. The monitoring operation may comprise pressure monitoring, temperature monitoring, monitoring for detection of toxic gas, and/or any other monitoring operations.

The broadly described method of the disclosure may comprise preventing gas-dispensing operation of the one or more gas supply vessels in the event that one or more process conditions deviate from predetermined process conditions, as the aforementioned gas hazard event. For example, the method may comprise preventing gas-dispensing operation of the one or more gas supply vessels when the monitored pressure (e.g., in dopant gas delivery lines) deviates from a sub-atmospheric pressure condition, as such gas hazard event.

Prevention of the gas-dispensing operation of the one or more gas supply vessels may be effectuated by closure of gas supply valves of the gas-dispensing gas supply vessel(s) and/or by closing gas flow control valve(s) in flow circuitry associated with the one or more gas supply vessels.

The method may be practiced, to maintain the gas box at sub-atmospheric pressure during dispensing of gas from the one or more gas supply vessels in the gas box.

Consistent with the foregoing description, the gas box may include an access structure that is openable to permit installation or change out of gas supply vessels in the gas box, and closable to configure the gas box for operation, with the method comprising exhausting gas from the gas box at the relatively higher gas box exhaust gas flow rate, when the gas box access structure is opened.

The broadly described method of the disclosure may be carried out in an ion implantation system comprising a vacuum chamber, wherein the method includes venting the vacuum chamber to ductwork for exhausting gas from the gas box, and exhausting gas from the vacuum chamber to the treating operation.

Accordingly, the method may be carried out in various implementations, as comprising terminating flow of ventilation gas through the housing and exhaust of ventilation gas from the housing to an ambient environment (e.g., a room or building in which the ion implantation system is deployed) of the ion implanter, upon occurrence of the gas hazard event. The occurrence of the gas hazard event may comprise detecting hazardous gas in the ventilation gas in the gas box (gas box exhaust) and/or detecting hazardous gas in the ventilation gas in the housing (shell exhaust).

Referring now to the drawings, FIG. 1 is a schematic representation of a semiconductor manufacturing facility 10 including a fab building 12 with a roof 14. In the building is disposed an ion implantation system including ion implantation system housing 16 defining an interior volume 18 therein. In the interior volume 18 of the housing 16 a gas box 20 is provided, defining an interior volume 22 therein.

The interior volume 22 of the gas box 20 contains gas supply vessels 24, 26, 28. Each of the gas supply vessels includes a valve head 30 containing a valve selectively translatable between fully open and fully closed positions by an associated pneumatic actuator 32. Each of the valve heads of the respective vessels is coupled with a gas dispensing line 34, and the respective gas dispensing lines are connected to dispensed gas feed line 36 in a manifold arrangement. The dispensed gas feed line 36 contains manifold isolation valve 38, which when open permits gas supplied by one or more of the gas supply vessels to be flowed to the ion source chamber 52.

The gas box 20 is provided with a gas box exhaust duct 40 containing variable position damper 42 and gas box exhaust blower 44, as well as exhaust duct temperature sensor 98. The gas box exhaust duct 40 conveys gas box exhaust gas from the gas box 20 interior volume 22, to the rooftop treatment unit 46, in which the gas box exhaust gas is treated to remove contaminants therefrom and/or treated to dilute the gas box exhaust gas with large volumes of air, to produce treated gas that is discharged in vent line 48 to the atmosphere.

The rooftop treatment unit 46 thus may comprise a catalytic oxidation unit, adsorbent bed for contacting with the gas box exhaust gas, a wet or dry scrubber, etc., to remove contaminants from the gas box exhaust gas so that it can be discharged to the atmosphere in vent line 48. The rooftop treatment unit 46 alternatively or additionally may comprise an intake arrangement for diluting the gas box exhaust with air from outside the fab building.

The interior volume 18 of the ion implantation system housing 16 contains an ion implant tool 50 comprising the aforementioned ion source chamber 52. The ion implant tool 50 includes an access door 104 for maintenance, inspection, etc. The ion source chamber 52 of the tool is operated under vacuum as a vacuum chamber during operation of the ion implantation system, and is provided with an access door 106 for maintenance, inspection, etc. the ion source chamber 52 may be provided with a removable cover 108, to which a flexible exhaust line 110 may be coupled, with the opposite end of such flexible exhaust line being coupleable to the gas box exhaust duct 40, for exhausting the ion source chamber 52 during maintenance, e.g., with the access doors 102, 104, and 106 being open to allow fab air to be drawn into the ion source chamber and exhausted through the gas box exhaust duct 40.

The ion source chamber 52 in the ion implant tool 50 is configured to operate to generate implant species from the precursor in the gas flowed thereto from dispensed gas feed line, by ionization of such gas, and the ion source chamber is associated with electrodes, atomic mass unit selection equipment, collimation components, etc. (not shown in FIG. 1) for generation of an ion beam 54 that is directed to be impinged on the substrate 56 on support 58 in the implant chamber 60.

The semiconductor manufacturing facility 10 includes a makeup air inlet line 88 which introduces ambient air into the makeup air processing unit 90, in which the makeup air is filtered, humidified/dehumidified, purified, and adjusted in temperature, to provide ventilation gas that is introduced into the interior volume 18 of the ion implantation system housing 16 via shell ventilation gas inlet line 92. This shell exhaust then flows through the interior volume 18 of the housing, and is drawn into the gas box through louvers 96 in the gas box access door 94. The ventilation gas entering the interior volume 22 of gas box 20 is exhausted to the gas box exhaust duct 40 at a rate that is controlled by the variable position damper 42 and the gas box exhaust blower 44, which may be of a variable speed type, serving to draw the ventilation gas as gas box exhaust gas into the exhaust duct 40 for flow to the rooftop treatment unit. The ventilation gas that is introduced to the interior volume 18 of the ion implantation system housing 16, after flow through such interior volume, is discharged to the fab by shell exhaust line 112, except for the volume that is drawn into the gas box 20.

The ion implantation system shown in FIG. 1 is provided with a monitoring and control assembly for operation of the system. Such monitoring and control assembly comprises a CPU 62 that is operatively linked to monitoring components in the interior volume 22 of the gas box. Such monitoring components include temperature sensor 64 which is joined in signal transmission relationship to the CPU 62 by temperature sensing signal transmission line 82. The monitoring components include pressure sensor 66 which is joined in signal transmission relationship to the CPU 62 by pressure sensing signal transmission line 80. The monitoring components also include toxic gas monitor 68 configured to detect the presence of hazardous gas, e.g., as a result of leakage from a gas supply vessel or manifold couplings. The toxic gas monitor is joined in signal transmission relationship to the CPU 62 by toxic gas monitor signal transmission line 78. It will be appreciated that any number and type of monitoring components may be utilized in the practice of the disclosure, to generate outputs that are transmitted by the respective signal transmission lines to the CPU, and in response to which the CPU modulates equipment and processing conditions in the ion implantation system to achieve efficient operation thereof The CPU 62 as illustrated may be configured to transmit an output control signals to various system elements. For example, the CPU may be configured to respond to inputted sensing signals indicative of a gas hazard event by transmitting control signals in signal transmission lines 70, 72, and 74 to the respective pneumatic valve actuators associated with the gas supply vessels, to close the respective valves in the valve heads of such gas supply vessels. The CPU may additionally be configured to isolate the gas feed manifold by transmission of a control signal in signal transmission line 76 to the manifold isolation valve 38, so that the valve is signaled to close in response to a gas hazard event.

The CPU 62 may also be configured to transmit a control signal in signal transmission line 84 to the variable position damper 42 to open such damper and facilitate an increased exhaust flow, in conjunction with transmission by the CPU of a control signal in signal transmission line 86 to the gas box exhaust blower 44, so that a high rate exhaust of gas from the interior volume 22 of the gas box 20 is achieved. Although the gas box 20 in the illustrated embodiment of FIG. 1 is shown as containing various sensor elements, it will be appreciated that corresponding elements may also be positioned in the gas box exhaust duct 40, e.g., as illustrated by the exhaust duct temperature sensor 98, which is arranged to output and exhaust duct temperature signal in signal transmission line 100 to the CPU 62.

Thus, the CPU 62 is configured to receive various sensing data indicative of the operation and process conditions in the ion implantation system, and responsively to controllably adjust the variable position damper 42 and gas box exhaust blower 44 to effect increased gas box exhaust flow rate in the occurrence of a gas hazard event, and to terminate dispensing of gas from the gas supply vessels in the gas box by closure of valves on the gas supply vessels and/or closure of an isolation valve 38 in the gas supply manifold flow circuitry.

The ion implantation system may also be configured with the CPU serving to increase gas box exhaust flow when one or more of the access doors 94, 102, 104, and 106 is opened by operating, inspection, or maintenance personnel, so that the gas box exhaust flow rate is immediately increased to enhance the safety of such access activities.

The variable position damper 42 may therefore be configured as fully continuously variable between endpoint positions, or it may be configured for two or more discrete position settings, so that the gas box exhaust gas flow rate is matched to normal operating conditions and gas hazard event conditions, but in either case, gas box exhaust gas flow rate is increased to a relatively higher level upon occurrence of the gas hazard event, in relation to a relatively lower level attendant normal (i.e., non-hazard event) operating conditions of the ion implantation system.

It will be appreciated that the monitoring and control assembly utilized in the broad practice of the present disclosure may be widely varied to provide for a wide spectrum of monitoring activity and responsive control actions to enhance the safety and efficiency of the ion implantation system.

The ion implant exhaust management apparatus and process of the present disclosure enable substantial reductions to be achieved in energy and capital equipment costs of ion implantation systems, in relation to ion implantation systems not utilizing the exhaust management apparatus and process of the present disclosure. The apparatus and process of the present disclosure provide safer, less costly implantation system air handling, and assist to minimize greenhouse gas emissions in semiconductor manufacturing operations.

Compared to other manufacturing tools in semiconductor facilities, ion implanters require the largest exhaust volume, typically using on the order of 2500 CFM in total ventilation, split between the gas box and the containment shell enclosure. Considering that a conventional semiconductor fab may contain 30+ implanters, the energy needed to replace this volume of clean, highly conditioned air is substantial and requires large infrastructure expenditures. The gas box exhaust, potentially containing hazardous materials, is typically sent through a scrubber before being released. Scrubbed (or acid) exhausts, therefore, consume more resources than shell exhaust and contribute more to the costs of fab operations The present disclosure recognizes that variable and capital costs of semiconductor manufacturing facilities can be reduced by reusing of a significant amount of the exhausted air volume associated with implanter operation, and embodies approaches to further reduce exhaust requirements and integrate ventilation management into the operating architecture of the ion implanter to achieve increased efficiency and safety.

The present disclosure also recognizes that in response to increased global warming concerns and the general trend of rising energy costs, semiconductor manufacturers must adopt aggressive energy reduction initiatives to stay competitive. Concurrently, fab designers are under continuous pressure to reduce capital costs of fab capacity expansions and greenfield projects. In this circumstance, improved ion implant exhaust management is an effective energy and cost reduction strategy.

Ion implant tools typically include two exhausted enclosures, the gas box and the outer containment shell. The gas box enclosure, located either within the terminal enclosure or stand-alone within the outer containment shell, depending on the tool design, contains the dopant gas cylinders and associated flow control and monitoring equipment. The gas box exhaust flow rate may range from 300 cfm to 500 cfm to maintain a minimum face velocity and dilution in the event of a pressurized gas leak. The terminal enclosure contains the source, beam line, associated roughing and high vacuum pumps, and various control and power components. Commonly referred to as the "shell" exhaust, the terminal enclosure exhaust is a means of heat rejection with a flow rate range of 1500 cfm to 2000 cfm. The outer containment enclosure serves primarily as a safety barrier between operating plant personnel and high voltage components.

The process effluent exhaust rate is small, typically less than 10-50 cfm, and it generally is treated either through a point-of-use abatement system or sent to the facility acid exhaust system for scrubbing prior to venting to the atmosphere.

The exhaust management approach of the present disclosure advantageously employs subatmospheric pressure gas supply packages for delivery of dopant gases, including adsorbent-based gas supply packages and/or internally pressure-regulated gas supply packages to deliver gas at subatmospheric pressure. Such gas supply packages, even if opened to the atmosphere, will release gas at levels below IDLH (immediately dangerous to life or health) levels defined by the US National Institute for Occupational Safety and Health (NIOSH) as exposure to airborne contaminants that is likely to cause death or immediate or delayed permanent adverse health effects or prevent escape from such an environment. Accordingly, they afford a significantly higher level of safety in relation to conventional high pressure gas cylinders. Additionally, they are particularly effective in assisting the reduction of exhaust requirements, e.g., by levels that may be on the order of 75%, by enabling recirculation of the terminal enclosure exhaust in lieu of venting it to the atmosphere. Subatmospheric pressure gas supply packages require a process vacuum to deliver the dopant gas, virtually eliminating accidental gas releases.

The use of subatmospheric pressure gas supply packages permits the gas box exhaust in the implanter system, which might otherwise be treated as acid exhaust due to the potential for gas leaks, to be reclassified, with the gas box exhaust being sent to the general exhaust system. As a result, capital expenditures for exhaust and make-up air infrastructure can be substantially reduced, along with substantial reductions in the energy costs of the implanter and in the $CO_2$ emissions from the implanter. Implant tool manufacturers typically recommend a minimum of 300 cfm of exhaust to be flowed through the gas box to provide dilution for a worst case high pressure toxic gas leak. In practice, the gas box flow rates are typically much higher, ranging from 400 to 500 cfm, in order to maintain the face velocity minimum of 200 fpm that is stipulated by the National Fire Protection Association standard, NFPA 1. Using a pressure switch to assure manifold delivery pressures remain subatmospheric, gas box exhaust rates can be reduced to nominally 170 cfm, sufficient to meet applicable codes. Recirculating the terminal enclosure exhaust and limiting the gas box exhaust to rates on the order of 170 cfm can produce 85-90% reduction in exhaust demand per tool. The capital cost avoidance opportunity for new fab construction is thus highly significant.

For an implant expansion project in which a new implant area will have dedicated exhaust, make-up air, and recirculation air systems, and with good design practice also dictating N+1 equipment redundancy for continuous manufacturing operation, the expansion project would realize substantial capital avoidance for each tool by a reduced exhaust configuration. In the case of greenfield projects the cost avoidance is likely to be significantly increased due to reduced demand on support systems such as chilled water, hot water and steam.

Additional exhaust reduction and safety advances can be achieved using the integrated approach of the present disclosure involving a smart exhaust system that nominally operates at a low level in relation to historical levels, e.g., at five percent of historical levels. Associated design and operating changes to the implanter operation may include the addition of pneumatic cylinder valve operators and variably exhausting the gas box as a function of actual risk.

The key to minimizing the occurrence and impact of a gas leak is maintaining the ion implanter system under subatmospheric pressure conditions at all times. Operating under sub-atmospheric pressure involves the continuous monitoring of gas pressure(s) in the delivery manifolds and the ability to respond quickly if pre-set pressure thresholds are exceeded.

The subatmospheric gas supply packages in current use to supply implant dopant gases typically use manual valves. Outfitting these dopant supply packages with normally closed, pneumatic valve operators provides the highest level of safety by ensuring that the gas can be contained at the source, i.e., within the gas supply vessel. Prevention begins with the detection of an over-pressure condition, and mitigation can potentially involve a number of actions up to cessation of gas flow using the pneumatic-operated, normally closed valve on the subatmospheric gas supply package.

The use of normally closed pneumatic valves enables isolation of the contents of the dopant gas supply package should the delivery manifold deviate from subatmospheric pressure protocols, e.g., as a result of internal regulator failures, or high temperature conditions in the gas box, and/or other emergency events.

Using pneumatic valves also reduces the level of human interaction during cylinder installation or emergency response. The normally closed condition removes from consideration cases where valves are either poorly closed or over-torqued. Gas supply package cycle purging can be done automatically, more efficiently, and without the possibility of backfilling purge gas into the gas supply package.

Using variable rate gas box exhaust, the exhaust gas management system has the ability to control leaks and act in advance of their occurrence, thereby allowing the gas box to be exhausted as a function of risk as opposed to the conventional practice of continuously operating at a rate needed to mitigate worst case release scenarios. This conventional practice is inefficient as it requires high levels of exhaust to be used during low risk periods. Utilizing subatmospheric pressure gas delivery, a low exhaust flow rate, e.g., a nominal exhaust flow rate of 40 cfm, is sufficient to satisfy applicable SEMI S2 and NFPA 318 standards.

A two-position damper can control the gas box exhaust in either a low or high flow mode. The normal or reduced exhaust condition, e.g., at an exhaust flow rate of 40 cfm, would be allowed when all of the dopant delivery packages are showing a sub-atmospheric pressure condition or when all of the gas supply package valves are closed.

Interlocks may be used to initiate high flow of exhaust gas rate any time the gas box door is opened, or during gas supply package changes or maintenance periods, or when triggered by events such as toxic gas detection, smoke detector alarm, or detection of a superatmospheric pressure condition in the dopant delivery manifold.

During normal operation, which may for example be >95% of the time, the gas box would operate at a nominal rate of 40 cfm. For a facility with 30+ implanters, this is a reduction of nominally 8500 cfm. Variable drive fans, common to conventional fabs, can accommodate the relatively small changes in gas box ventilation rates envisioned by "event driven" changes in gas box flows.

The principal dopant gases used in ion implantation are arsine, phosphine, and boron trifluoride, with secondary quantities of germanium tetrafluoride, silicon tetrafluoride, and carbon monoxide also being consumed. In the case of boron trifluoride, >50% of the boron trifluoride survives the process chamber and is discharged in the process exhaust. The metal hydrides, by contrast, are largely consumed under process conditions.

A breach in the vacuum pump system or process exhaust piping could allow toxic gases, e.g., boron trifluoride, into the containment shell of the implanter. Detection of toxics within the implanter containment shell may be employed to trigger (1) shut-down of the booster fans used to exhaust the shell and (2) an increase in the level of exhaust from the gas box (high exhaust mode) to ensure that a clean room is protected. Since the gas box obtains its air supply from within the implanter, the toxics would be expelled via the gas box exhaust, with the implanter staying at negative pressure relative to the clean room.

Thus, the present disclosure contemplates improvements in exhaust/energy reduction of ion implanters, by the provision of an integrated exhaust system for ion implanters, that may include: (i) operating gas delivery under sub-atmospheric pressure conditions at all times, (ii) adding pneumatic valve operators, (iii) variably exhausting the gas box at a rate that is proportional to actual risk conditions, and (iv) using interlocks and safety controls appropriate for the risks involved.

Maximum benefit is realized in greenfield installations where the make-up air and infrastructure can be sized for actual practice.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. An ion implantation system, comprising:
   an ion implanter comprising a housing defining an enclosed volume in which is positioned a gas box configured to hold one or more gas supply vessels, the gas box being in restricted gas flow communication with gas in the enclosed volume that is outside the gas box;
   a first ventilation assembly configured to flow ventilation gas through the housing and to exhaust the ventilation gas from the housing to an ambient environment of the ion implanter;
   a second ventilation assembly configured to exhaust gas from the gas box to a treatment apparatus that is adapted to at least partially remove contaminants from the gas box exhaust gas, or that is adapted to dilute the gas box exhaust gas, to produce a treated effluent gas, the second ventilation assembly comprising a variable flow control device for modulating flow rate of the gas box exhaust gas between a relatively lower gas box exhaust gas flow rate and a relatively higher gas box exhaust gas flow rate, and a motive fluid driver adapted to flow the gas box exhaust gas through the variable flow control device to the treatment apparatus; and
   a monitoring and control assembly configured to monitor operation of the ion implanter for occurrence of a gas hazard event, and thereupon to responsively prevent gas-dispensing operation of the one or more gas supply vessels, and to modulate the variable flow control device to the relatively higher gas box exhaust gas flow rate so that the motive fluid driver flows the gas box exhaust gas to the treatment apparatus at the relatively higher gas box exhaust gas flow rate, wherein the monitoring and control assembly terminates operation of the first ventilation assembly upon a gas hazard event.

2. The ion implantation system of claim 1, wherein the variable flow control device comprises a variable position flow damper device treatment apparatus adapted to dilute the gas box exhaust gas, to produce the treated effluent gas.

3. The ion implantation system of claim 1, wherein the monitoring and control assembly comprises pneumatic valve actuators arranged to actuate flow control valves of the one or more gas supply vessels when present in the gas box.

4. The ion implantation system of claim 1, wherein one or more gas supply vessels are contained in the gas box.

5. The ion implantation system of claim 1, wherein the motive fluid driver comprises a variable frequency driver.

6. The ion implantation system of claim 1, wherein the monitoring and control assembly comprises one or more sensors configured to sense process condition(s) within the enclosure and/or the gas box, wherein the monitoring and control assembly responsively modulates the variable flow control device based on process condition sensing of the one or more sensors.

7. The ion implantation system of claim 1, wherein the ion implanter comprises an ion source chamber arranged to receive gas from at least one of the one or more gas supply vessels in the gas box by flow of dispensed gas through gas flow circuitry interconnecting the gas-dispensing gas supply vessel(s) with the ion source chamber.

8. The ion implantation system of claim 1, wherein the monitoring and control assembly is configured to maintain the gas box at sub-atmospheric pressure during dispensing of gas from the one or more gas supply vessels in the gas box.

9. The ion implantation system of claim 1, wherein the gas box includes an access structure that is openable to permit installation or change out of gas supply vessels in the gas box, and closable to configure the gas box for operation, wherein the monitoring and control assembly is configured to modulate the variable flow control device to the relatively higher gas box exhaust gas flow rate so that the motive fluid driver flows the gas box exhaust gas to the treatment apparatus at the relatively higher gas box exhaust gas flow rate, when the gas box access structure is opened.

10. The ion implantation system of claim 1, wherein the monitoring and control assembly comprises a gas flow line that is selectively coupleable to interconnect a vacuum chamber of the ion implantation system with the second ventilation assembly for ventilating the vacuum chamber during access thereof by operating, inspection, or maintenance personnel.

11. A method of operating an ion implantation system including an ion implanter comprising a housing defining an enclosed volume in which is positioned a gas box configured to hold one or more gas supply vessels, the gas box being in restricted gas flow communication with gas in the enclosed volume that is outside the gas box, said method comprising:
   flowing ventilation gas through the housing and exhausting the ventilation gas from the housing to an ambient environment of the ion implanter;
   exhausting gas from the gas box and treating same to at least partially remove contaminants from the gas box exhaust gas, or to dilute the gas box exhaust gas, to produce a treated effluent gas;
   monitoring operation of the ion implanter for occurrence of a gas hazard event, wherein upon occurrence of the gas hazard event, terminating said flowing of ventilation gas through the housing and exhausting of the ventilation gas from the housing to an ambient environment of the ion implanter;
   during non-occurrence of a gas hazard event during said monitoring, exhausting gas from the gas box for said treating, at a relatively lower gas box exhaust flow rate;

and upon occurrence of a gas hazard event during said monitoring, preventing gas-dispensing operation of the one or more gas supply vessels, and exhausting gas from the gas box for said treating, at a relatively higher gas box exhaust flow rate.

12. The method of claim 11, wherein each of the one or more gas supply vessels has a pneumatic valve actuator operatively coupled thereto, and the pneumatic valve actuators are actuated for said preventing of gas-dispensing operation.

13. The method of claim 11, comprising preventing gas-dispensing operation of the one or more gas supply vessels in the event that one or more process conditions deviate from predetermined process conditions, as said gas hazard event.

14. The method of claim 11, comprising preventing gas-dispensing operation of the one or more gas supply vessels when pressure of the dispensed gas deviates from a sub-atmospheric pressure condition, as said gas hazard event.

15. The method of claim 11, comprising preventing gas-dispensing operation of the one or more gas supply vessels, by closure of gas supply valves of the gas-dispensing gas supply vessel(s) and/or by closing gas flow control valve(s) in flow circuitry associated with the one or more gas supply vessels.

16. The method of claim 11, wherein the gas box includes an access structure that is openable to permit installation or change out of gas supply vessels in the gas box, and closable to configure the gas box for operation, comprising exhausting gas from the gas box at the relatively higher gas box exhaust gas flow rate, when the gas box access structure is opened.

17. The method of claim 11, wherein the ion implantation system comprises a vacuum chamber, comprising venting the vacuum chamber to ductwork for said exhausting gas from the gas box, and exhausting gas from the vacuum chamber to said treating.

* * * * *